(12) United States Patent
Mori et al.

(10) Patent No.: US 10,153,385 B2
(45) Date of Patent: Dec. 11, 2018

(54) BACK CONTACT TYPE SOLAR BATTERY CELL

(71) Applicant: SHIN-ETSU CHEMICAL CO., LTD., Tokyo (JP)

(72) Inventors: Chikara Mori, Annaka (JP); Takenori Watabe, Annaka (JP); Hiroyuki Otsuka, Kitasakugun Karuizawamachi (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/892,845

(22) PCT Filed: May 8, 2014

(86) PCT No.: PCT/JP2014/062386
§ 371 (c)(1),
(2) Date: Nov. 20, 2015

(87) PCT Pub. No.: WO2014/196307
PCT Pub. Date: Dec. 11, 2014

(65) Prior Publication Data
US 2016/0118515 A1    Apr. 28, 2016

(30) Foreign Application Priority Data
Jun. 7, 2013 (JP) ................. 2013-120826

(51) Int. Cl.
*H01L 31/0224* (2006.01)
*H01L 31/05* (2014.01)
*H01L 31/068* (2012.01)

(52) U.S. Cl.
CPC ............. *H01L 31/022458* (2013.01); *H01L 31/022433* (2013.01); *H01L 31/022441* (2013.01);
(Continued)

(58) Field of Classification Search
CPC ......... H01L 31/022441; H01L 31/0516; H01L 31/022433; H01L 31/0682; H01L 31/022458
(Continued)

(56) References Cited

U.S. PATENT DOCUMENTS 5,178,685 A * 1/1993 Borenstein ........ H01L 31/02242
136/244
2008/0216887 A1* 9/2008 Hacke ............... H01L 31/02244
136/244
(Continued)

FOREIGN PATENT DOCUMENTS

JP    S60-239067 A    11/1985
JP    H09-116175 A    5/1997
(Continued)

OTHER PUBLICATIONS

Jun. 24, 2014 Internationl Search Report issued in International Patent Application No. PCT/JP2014/062386.
(Continued)

*Primary Examiner* — Allison Bourke
(74) *Attorney, Agent, or Firm* — Oliff PLC

(57) ABSTRACT

A back contact type solar battery which provides a reduced electric power loss, free positioning of a bus bar, and a simple manufacturing process. The solar battery includes: semiconductor substrate; first conductivity type region formed on back surface side located on the opposite side of acceptance surface side of the semiconductor substrate; second conductivity type region formed on the back surface side of the semiconductor substrate; first conductivity type collecting electrode linearly formed on the first conductivity type region; and second conductivity type collecting electrode linearly formed on the second conductivity type region. The first and second conductivity type regions are alternately arranged. Each of the first and second conduc-
(Continued)

tivity type collecting electrodes has discontinuous places. The discontinuous places of each conductivity type are substantially aligned on straight line in arrangement direction in which the first and second conductivity type regions are alternately arranged.

5 Claims, 8 Drawing Sheets

(52) U.S. Cl.
CPC ...... *H01L 31/0516* (2013.01); *H01L 31/0682* (2013.01); *Y02E 10/547* (2013.01)

(58) Field of Classification Search
USPC ........................................ 136/256
See application file for complete search history.

(56) References Cited

U.S. PATENT DOCUMENTS

2009/0145479 A1* 6/2009 Williams ............ H01L 31/0508
136/256
2011/0120530 A1 5/2011 Isaka
2012/0305063 A1* 12/2012 Moslehi ............ H01L 31/03528
136/256

FOREIGN PATENT DOCUMENTS

| JP | 2005-175399 A | 6/2005 |
| JP | 2006-324590 A | 11/2006 |
| WO | 2009/025147 A1 | 2/2009 |

OTHER PUBLICATIONS

Jun. 24, 2014 Written Opinion issued in International Patent Application No. PCT/JP2014/062386.
Dec. 8, 2015 International Preliminary Report on Patentability issued in International Patent Application No. PCT/JP2014/062386.
May 16, 2016 Written Opinion issued in Singapore Patent Application No. 11201509558V.
Nov. 22, 2016 Office Action issued in Japanese Patent Application No. 2015-521348.
Dec. 15, 2016 extended European Search Report issued in Application No. 14808232.4.

* cited by examiner

BACK CONTACT TYPE SOLAR BATTERY CELL

TECHNICAL FIELD

The present invention relates to aback contact type solar battery.

BACKGROUND ART

A conventionally main solar battery is manufactured by, for example, diffusing impurities having the opposite conductivity type to that of a single crystal or polycrystal silicon substrate into an acceptance surface of the silicon substrate to form p-n junction, and forming an electrode on each of the acceptance surface of the silicon substrate and a back surface located on the opposite side of the acceptance surface.

The main silicon solar battery has the acceptance surface having a front electrode (often including a metal electrode referred to as a bus bar and a finger) formed thereon and made of a metal. The front electrode blocks incident sunlight, which disadvantageously loses the output of the solar battery.

Then, a so-called back contact type solar battery is developed, which is obtained by forming an electrode only on a back surface of a silicon substrate without forming an electrode on an acceptance surface of the silicon substrate. The back contact type solar battery having the acceptance surface having no electrode formed thereon can take 100% of incident sunlight into the solar battery without having a shadow loss caused by an electrode, which can fundamentally achieve high efficiency.

When the sunlight is incident on the acceptance surface of the back contact type solar battery, careers generated near the acceptance surface of the silicon substrate reach p-n junction formed on the back surface of the back contact type solar battery. The careers are collected by a p-type finger electrode and an n-type finger electrode, and taken out to the outside.

FIG. 1 shows an electrode structure of a general solar battery. An electrode includes a finger part 102 and a bus bar part 103. The finger part 102 is a collecting electrode formed for the purpose of efficiently collecting a photoelectric current generated from the solar battery without causing a resistance loss. The bus bar part 103 collects the current through the finger part 102, and functions as a ground of a tab line. FIG. 2 shows a current flow when a tab line is applied to an acceptance surface of the general solar battery cell. As shown in FIG. 2, electrons generated within a silicon substrate 201 are collected by a finger 202 adjacent to the electrons. Furthermore, a current flows into a bus bar 203 adjacent to the finger 202, and is taken out as electric power via a tab line 204. As described above, the bus bar functions to collect the current collected by the finger, and is desirably connected to as many fingers as possible. As shown in FIG. 3A, a considerable current flows also into a diffusion layer 304 directly below a finger 301 in parallel to a current 303 of a bus bar 302 from the finger 301. The current passes through the diffusion layer even if the finger 301 is disconnected in a minimal region as shown in FIG. 3B, which provides a decrease in a resistance loss between a place in which the current is generated and the bus bar.

When a finger electrode has a decreased cross-sectional area, the finger electrode has an increased serial resistance, which causes a large output loss. Thereby, the cross-sectional area is designed to be increased. That is, the height or width of the electrode are designed to be increased. However, the former requires a plurality of processes and a protracted treatment, and is further limited. The latter can reduce a serial resistance value, but causes a decrease in the acceptance area and a deterioration in surface passivation, as a result of which the output of the solar battery is decreased in many cases. The present techniques reach a ceiling as the method for providing the high power of the solar battery.

Examples of the method for decreasing the serial resistance include increasing the cross-sectional area of the finger, and shortening a finger length. FIG. 4 shows a back surface electrode structure of a general back contact cell. The back contact type solar battery has a longer finger length than that of a general solar battery having each surface having an electrode formed thereon. There is sufficient room for an improvement in the back contact type solar battery.

A back contact type solar battery is disclosed, in which a bus bar can be formed also within a substrate region by fragmenting a conductivity type region and a conductivity type electrode formed thereon in order to shorten a finger length (Patent Literature 1).

CITATION LIST

Patent Literature

Patent Literature 1: JP 2009-025147 W

SUMMARY OF INVENTION

Technical Problem

However, in the back contact type solar battery of Patent Literature 1, at least two of the fragmented bus bars are installed near both the ends of the substrate in the longitudinal direction of the bus bar, and only one side of the bus bar installed near the end of the substrate is connected to the finger. Therefore, the number of the fingers which can collect a current for one bus bar is decreased although the back contact type solar battery has a constitution in which a number of bus bars can be provided, which cannot sufficiently take advantage of the bus bars.

In view of the circumstances, it is an object of the present invention to provide a back contact type solar battery which can improve characteristics, has a flexibility for positioning a bus bar, and can be comparatively easily manufactured.

Solution to Problem

A solar battery according to the present invention includes: a semiconductor substrate; a first conductivity type region formed on a back surface side located on the opposite side of an acceptance surface side of the semiconductor substrate; a second conductivity type region formed on the back surface side of the semiconductor substrate; a first conductivity type collecting electrode substantially linearly formed on the first conductivity type region; and a second conductivity type collecting electrode substantially linearly formed on the second conductivity type region, wherein the first and second conductivity type regions are alternately arranged, each of the first and second conductivity type collecting electrodes has discontinuous places, and the discontinuous places of each conductivity type are substantially aligned on a straight line in an arrangement direction in which the first and second conductivity type regions are alternately arranged.

A portion adjacent to each of the discontinuous places in each of the first and second conductivity type collecting electrodes may be formed as a small bus bar thicker than the other portion in each of the first and second conductivity type collecting electrodes. The small bus bar in each of the first and second conductivity type collecting electrodes may have a line width of 200 to 2000 μm, and the portion other than the small bus bar in each of the first and second conductivity type collecting electrodes may have a line width of 50 to 500 μm.

The small bus bar may be provided at a position which is not adjacent to a longitudinal end of each of the first and second conductivity type collecting electrodes in the semiconductor substrate. The discontinuous places of one of the first and second conductivity type collecting electrodes may be adjacent to the small bus bars of the other of the first and second conductivity type collecting electrodes in the arrangement direction.

The number of the discontinuous places is preferably 1 to 4 in a longitudinal direction of each of the first and second conductivity type collecting electrodes.

Advantageous Effects of Invention

The present invention can provide a back contact type solar battery which can improve characteristics.

DESCRIPTION OF EMBODIMENTS

Hereinafter, a back contact type solar battery cell in one embodiment of the present invention will be described with reference to the drawings. The size and shape of each of members are schematically shown in a modification or exaggeration form for the convenience of illustration.

Figure 1:
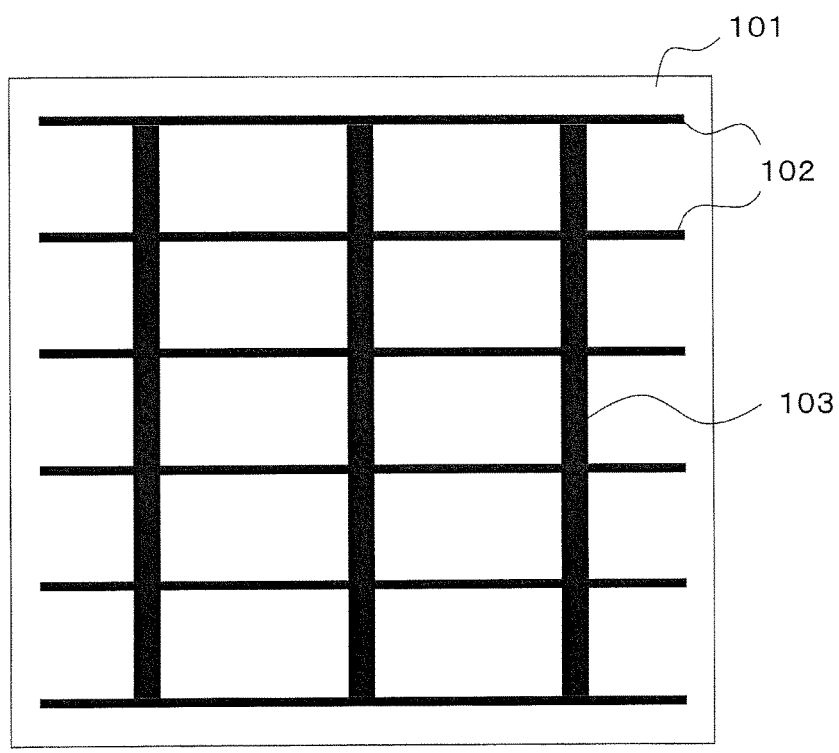
FIG. 1 is a schematic view of an electrode structure of a general solar battery cell.
Figure 2:
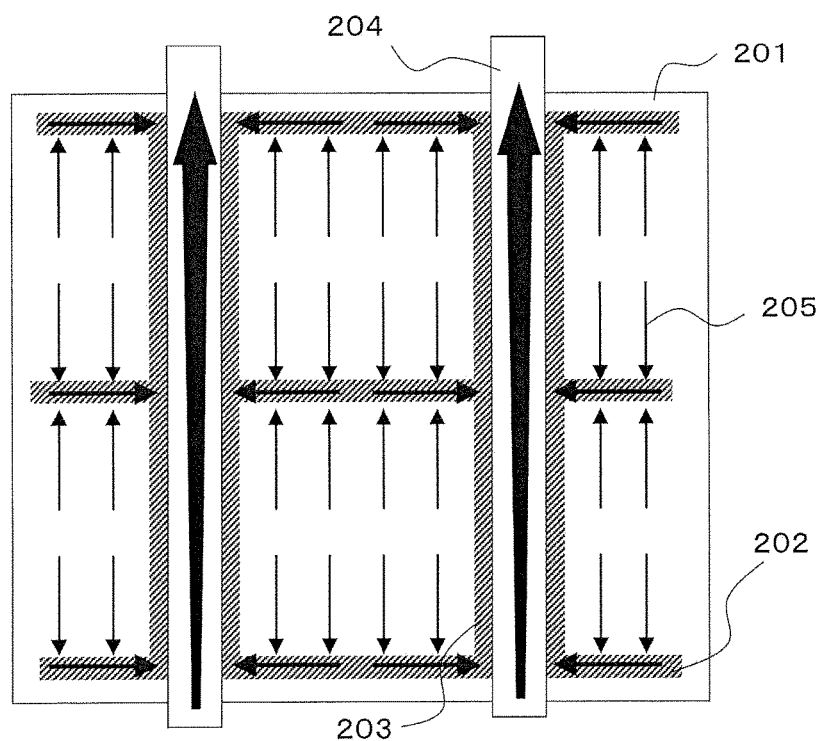
FIG. 2 is a schematic view of a current flow when a tab line is applied to an acceptance surface of the general solar battery cell.
Figure 3A:
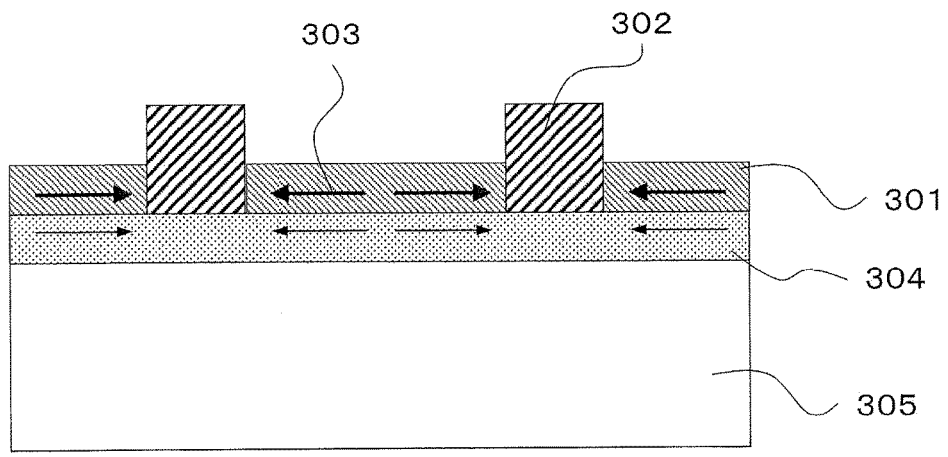
FIG. 3A is a sectional view of a current flow in the general solar battery cell.
Figure 3B:
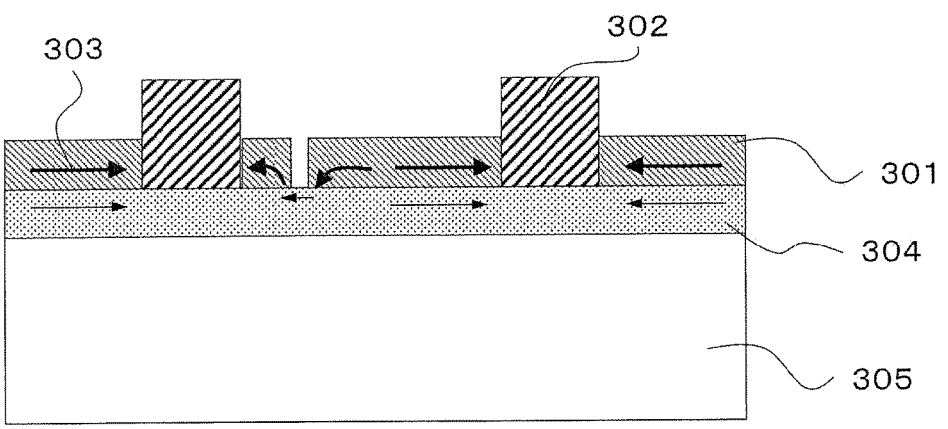
FIG. 3B is a sectional view of a current flow in a solar battery cell having a locally disconnected electrode.
Figure 4:
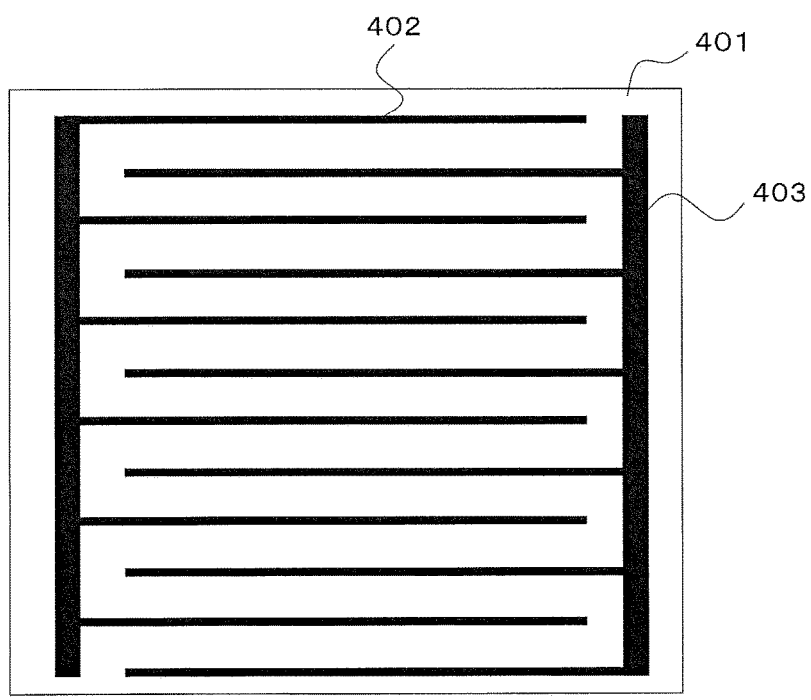
FIG. 4 is a schematic view of a back surface electrode structure of a general back contact type solar battery cell.
Figure 5:
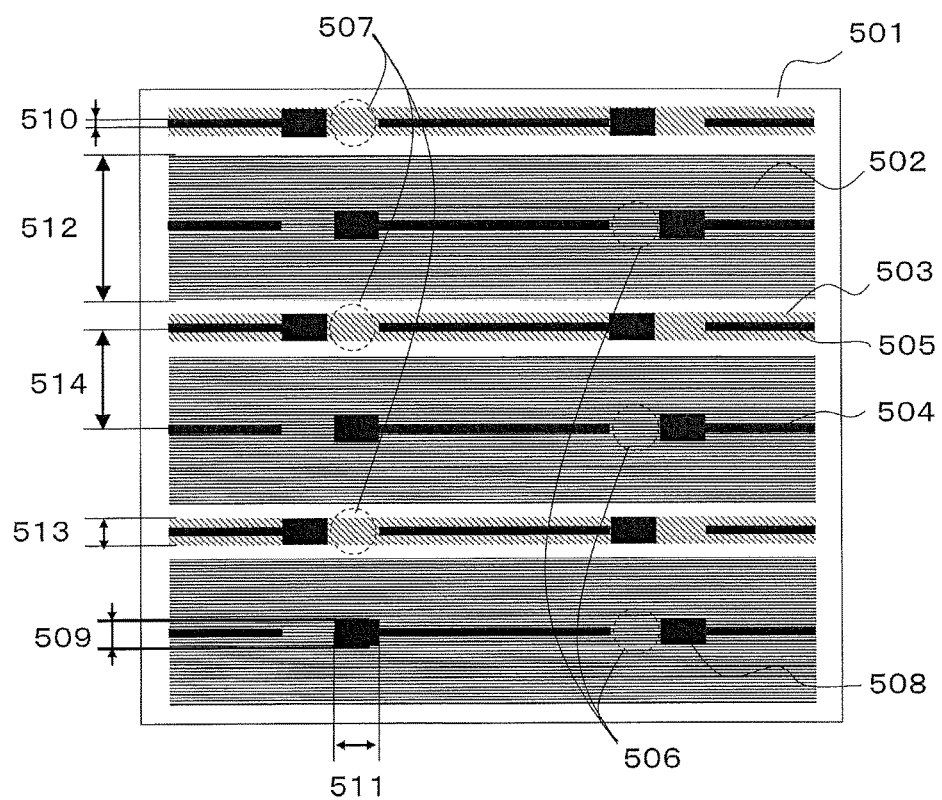
FIG. 5 is an example of a diffusion region and a back surface electrode structure in a back contact type solar battery cell of the present invention.

As shown in FIG. 5, in a solar battery of the present invention, on a back surface side of a silicon substrate 501, a first conductivity type diffusion region 502 and a second conductivity type diffusion region 503 having a higher concentration than that of the substrate are alternately and continuously formed substantially linearly at a predetermined distance. A plurality of linear first conductivity type collecting electrodes 504 or second conductivity type collecting electrodes 505 are discontinuously formed on the first conductivity type diffusion region 502 or the second conductivity type diffusion region 503. The silicon substrate 501 has a second conductivity type. In the present application, a direction where the first conductivity type diffusion region 502 and the second conductivity type diffusion region 503 linearly extend is referred to as a "longitudinal direction", and a direction where the first conductivity type diffusion region 502 and the second conductivity type diffusion region 503 are alternately arranged is referred to as an "arrangement direction".

As shown in FIG. 5, electrode discontinuous places 506 are substantially aligned on a straight line in the arrangement direction, and electrode discontinuous places 507 are substantially aligned on a straight line in the arrangement direction. That is, the longitudinal direction of the first conductivity type collecting electrode 504 or second conductivity type collecting electrode 505 is a horizontal direction in FIG. 5. The electrode discontinuous places 506 are substantially aligned on a straight line in a vertical direction in FIG. 5. The electrode discontinuous places 507 are substantially aligned on a straight line in the vertical direction in FIG. 5.

One to four discontinuous places 506 are formed between both the ends of a semiconductor substrate in the longitudinal direction in the first conductivity type collecting electrode 504, and one to four discontinuous places 507 are formed between both the ends of the semiconductor substrate in the longitudinal direction in the second conductivity type collecting electrode 505.

The line width of a portion 508 corresponding to a bus bar part in the first conductivity type collecting electrode 504 or the second conductivity type collecting electrode 505 may be more thickly formed than that of the other portion. The portion 508 corresponding to the bus bar part is preferably adjacent to the discontinuous place 506 or 507 having the same conductivity type. Hence, for convenience sake, the portion 508 corresponding to the bus bar part is referred to as a small bus bar.

Second conductivity type small bus bar portions 508 are preferably provided on the substantially same straight line in the arrangement direction in which the discontinuous places 506 are provided side by side. First conductivity type small bus bar portions 508 are preferably provided on the substantially same straight line in the arrangement direction in which the second discontinuous places 507 are provided side by side.

It is preferable that the small bus bar 508 has a line width 509 of 200 to 2000 μm, and the collecting electrode has a line width 510 of 50 to 500 μm at a place other than the small bus bar 508. Herein, the small bus bar 508 preferably has a length 511 of 200 to 5000 μm. Each of the electrode discontinuous places 506 and 507 preferably has a length of 300 to 6000 μm. Each of the electrode discontinuous places 506 and 507 is preferably longer by about 100 to 1000 μm than the small bus bar 508.

It is preferable that the first conductivity type diffusion region 502 has a width 512 of 500 to 5000 μm, and the second conductivity type diffusion region 503 has a width 513 of 50 to 1000 μm. It is preferable that the width 512 of the first conductivity type diffusion region 502 is greater than the width 513 of the second conductivity type diffusion region 503. A distance 514 between the first conductivity type collecting electrode 504 and the second conductivity type collecting electrode 505 is preferably 300 to 5000 μm.

Figure 6:
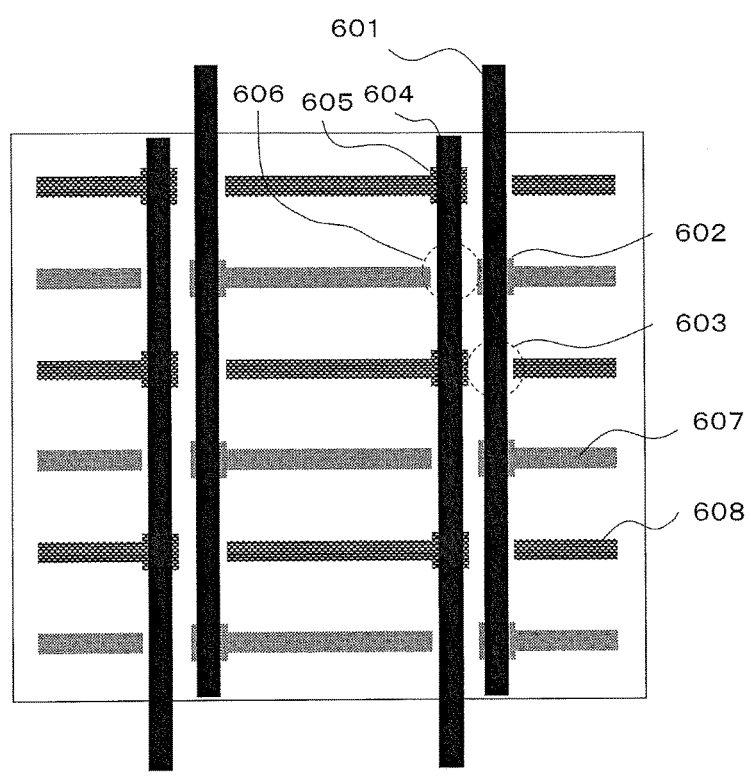
FIG. 6 is an example of the back surface electrode structure and a tab line position in the back contact type solar battery cell of the present invention.

By the cell structure, as shown in FIG. 6, during module production, a first conductivity type tab line 601 is installed on a first conductivity type small bus bar 602 and a discontinuous place 603 of a second conductivity type collecting electrode 608. A second conductivity type tab line 604 is installed on a second conductivity type small bus bar 605 and a discontinuous place 606 of a first conductivity type collecting electrode 607.

The material and shape of each of the tab lines 601 and 604 are not particularly limited as long as the tab lines 601 and 604 are conductive. For example, the tab lines 601 and 604 are preferably made of a strip-shaped conductive material such as a foil- or plate-shaped conductive material. When the tab line is strip-shaped, the tab line preferably has a width of about 200 to 5000 µm and a thickness of about 50 to 500 µm. The width of the tab line is preferably shorter by about 100 to 1000 µm than the length of the discontinuous place. Therefore, a sufficient clearance can be secured between the discontinuous place of the different conductivity type collecting electrode and the tab line provided on the discontinuous place.

The tab line contains various metals and alloys. For example, the tab line contains metals such as Au, Ag, Cu, Pt, Al, Ni, and Ti, or alloys thereof. Among them, Cu is preferably used. Solder plating made of an alloy containing Sn, Pb, and Cu is preferably applied to the tab line.

Soldering is used in order to electrically bond the small bus bar 602 or 605 and the tab line 601 or 604 installed thereon. Herein, the term "soldering" refers to applying a flux onto the small bus bar 602 or 605, installing the tab line thereon, and heating the entire cell to join the small bus bar 602 or 605 and the tab line 601 or 604.

The small bus bar 602 or 605 is absent near the end of the substrate in the longitudinal direction, and installed inside the substrate. Herein, the first conductivity type collecting electrode 607 which is present on the same straight line in the longitudinal direction is discontinuous. However, at a discontinuous place 606, a diffusion layer which is a minimal region is present, which provides a decrease in a resistance loss in the discontinuous place 606. On the other hand, the second conductivity type tab line 604 is electrically separated without being soldered to the discontinuous place 606. The second conductivity type collecting electrode 608 which is present on the same straight line in the longitudinal direction is discontinuous. However, at a discontinuous place 603, a diffusion layer which is a minimal region is present, which provides a decrease in a resistance loss in the discontinuous place 603. On the other hand, the first conductivity type tab line 601 is electrically separated without being soldered to the discontinuous place 603. Therefore, in the present application, all the small bus bars 602 or 605 can include a finger on each of both sides, and the number of fingers which can effectively collect a current is increased for one small bus bar 602 or 605. This can reduce a serial resistance, which allows an improvement in the efficiency of the solar battery.

Since small bus bar positions are substantially linearly aligned, and the first conductivity type small bus bar and the second conductivity type small bus bar are adjacent to each other, the flux is likely to be applied when the tab line is bonded, which facilitates modular manufacture as compared with a general back contact type solar battery.

Hereinafter, an example of a method for producing a solar battery of the present invention will be described. However, the present invention is not limited to the solar battery produced by the method.

A group-III element such as boron or gallium is doped into high purity silicon, and slice damage on a surface of an Ascut single crystal {100} p-type silicon substrate having a specific resistance of 0.1 to 5 Ω·cm is etched by using highly-concentrated alkali such as sodium hydroxide or potassium hydrate having a concentration of 5 to 60 mass %, or a mixed acid containing fluoric acid and nitric acid, or the like. The single crystal silicon substrate may be produced by any of a CZ method and a FZ method.

Subsequently, the surface of the substrate is subjected to minute concavo-convex formation referred to as texture. The texture is a method effective for reducing the reflectance of the solar battery. The texture is easily produced by immersing the substrate into a heated alkali solution (concentration: 1 to 10 mass %, temperature: 60 to 100° C.) such as sodium hydroxide, potassium hydrate, potassium carbonate, sodium carbonate, or sodium bicarbonate for about 10 to 30 minutes. A predetermined amount of 2-propanol is dissolved in the solution for reaction promotion in many cases.

After the texture formation, the substrate is washed in an acid aqueous solution such as hydrochloric acid, sulfuric acid, nitric acid, fluoric acid, or a mixed solution thereof. From economic and efficient standpoints, the substrate is preferably washed in the hydrochloric acid. In order to raise a cleaning level, the substrate may be washed with a solution obtained by mixing 0.5 to 5% of hydrogen peroxide with a hydrochloric acid solution, and warming the mixed solution to 60 to 90° C.

An emitter layer and BSF are formed on the back surface side of the silicon substrate. The back contact type solar battery of the present application requires the formation of p-n junction only in a desired region on the back surface. In order to achieve the formation, it is necessary to form a diffusion layer according to patterning or to form a silicon oxide film or a silicon nitride film or the like as a diffusion mask in a region other than a desired diffusion region before diffusion, to prevent the formation of the p-n junction in the region other than the desired diffusion region.

Figure 7:
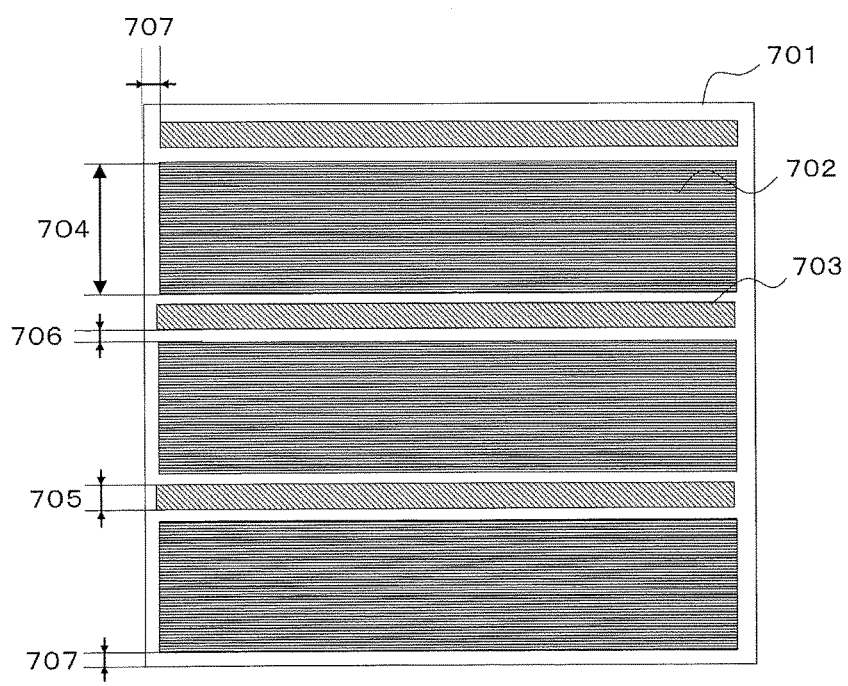
FIG. 7 is an example of a diffusion pattern in the back contact type solar battery cell of the present invention.

As shown in FIG. 7, when a p-type silicon substrate 701 is used, for example, the desired diffusion region preferably has a pattern in which an n-type diffusion region 702 and a p-type diffusion region 703 having a higher concentration than that of the substrate are alternately formed in a strip shape. It is preferable that the n-type diffusion region 702 has a width 704 of 500 to 5000 µm, and the p-type diffusion region 703 has a width 705 of 50 to 2000 µm. It is preferable that the width 704 of the n-type diffusion region 702 is greater than the width 705 of the p-type diffusion region 703. A space 706 between the n-type diffusion region 702 and the p-type diffusion region 703 preferably has a width of 50 to 500 µm. A space 707 between the end of the substrate and the end of the diffusion layer nearest to the end of the substrate preferably has a width of 200 to 2000 µm.

In a method for forming an oxide film, there can be utilized various methods such as deposition according to plasma CVD and a method for applying a polymer containing silicon, and thereafter curing the polymer by heating. The oxide film used as the diffusion mask desirably has a film thickness of 100 to 200 nm.

In case example shown herein, a p-type diffusion layer is previously formed. For example, if the plasma CVD is used, a pattern-type plate which can prevent the deposition of an oxide film on a desired p-type diffusion region is placed on a substrate, to form an oxide film in a region other than the desired p-type diffusion region (for example, also an entire acceptance surface side). If the polymer containing silicon is used, the polymer containing silicon is applied to the region other than the desired p-type diffusion region (for example, also the entire acceptance surface side) according to screen printing, and cured by heating with a hot plate or the like, to form an oxide film in the region other than the desired p-type diffusion region. A coating agent containing a dopant is applied to a back surface, and then heat-treated at 900 to 1000° C., to form the p-type diffusion region on the back surface. The applying diffusion may be vapor-phase diffusion using $BBr_3$. After the heat treatment, a glass component adhering to the silicon substrate is washed by glass etching or the like. At this time, simultaneously, the oxide film formed in the region other than the p-type diffusion region is also removed. Any p-type dopant is used as the dopant, and boron is particularly preferably used. A sheet resistance is 1 to 100Ω/□, and preferably 3 to 40 Ω/□.

Next, an n-type diffused layer is formed. An oxide film is formed on a region other than a desired n-type diffusion region (also the entire acceptance surface side) by the same treatment. A coating agent containing a dopant is applied onto the back surface, and then heat-treated at 900 to 1000° C., to form the n-type diffusion region on the back surface. The applying diffusion may be vapor-phase diffusion using $POCl_3$. After the heat treatment, a glass component adhering to the silicon substrate is washed by glass etching or the like. At this time, simultaneously, the oxide film formed in the region other than the n-type diffusion region is also removed. Any n-type dopant is used as the dopant, and phosphorus is particularly preferably used. A sheet resistance is 20 to 200Ω/□, and preferably 40 to 100 Ω/□.

Subsequently, in order to reduce dangling bond serving as one of recombination sites, an oxide film is formed on the silicon substrate. The silicon substrate having the diffusion layer formed thereon is treated at 800 to 1000° C. under oxygen environment for 0.5 to 2 hours, to form a silicon oxide film serving as a passivation film. The silicon oxide film preferably has a film thickness of 3 to 30 nm.

Next, an antireflection film is formed on each of the back and front surfaces. A silicon nitride film which is a dielectric film is deposited on each of the back and front surfaces of the substrate by a plasma CVD method. The silicon nitride film preferably has a film thickness of 70 to 100 nm. As a reactant gas, silane ($SiH_4$) and ammonia ($NH_3$) are used in a mixed state in many cases. Nitrogen can also be used in place of $NH_3$. In order to adjust process pressure, dilute the reactant gas, and promote the bulk passivation effect of the substrate when polycrystalline silicon is used for the substrate, hydrogen may be mixed with the reactant gas. Thermal CVD and photo CVD or the like may be used in addition to the method according to plasma, as a method for exciting the reactant gas for CVD. Alternative examples of the antireflection film include silicon oxide, a titanium dioxide film, a zinc oxide film, a tin oxide film, a tantalum oxide film, a niobium oxide film, a magnesium fluoride film, and an aluminum oxide film. Examples of the formation method include a coating method and a vacuum evaporation method in addition to the above. From the economic viewpoint, the silicon nitride film is suitably formed by the plasma CVD method.

Then, an electrode is formed. For example, a paste primarily containing silver is printed in a predetermined pattern on the p-type diffusion layer and the n-type diffused layer on the back surface of the substrate using a screen printing device or the like, followed by drying.

Figure 8:
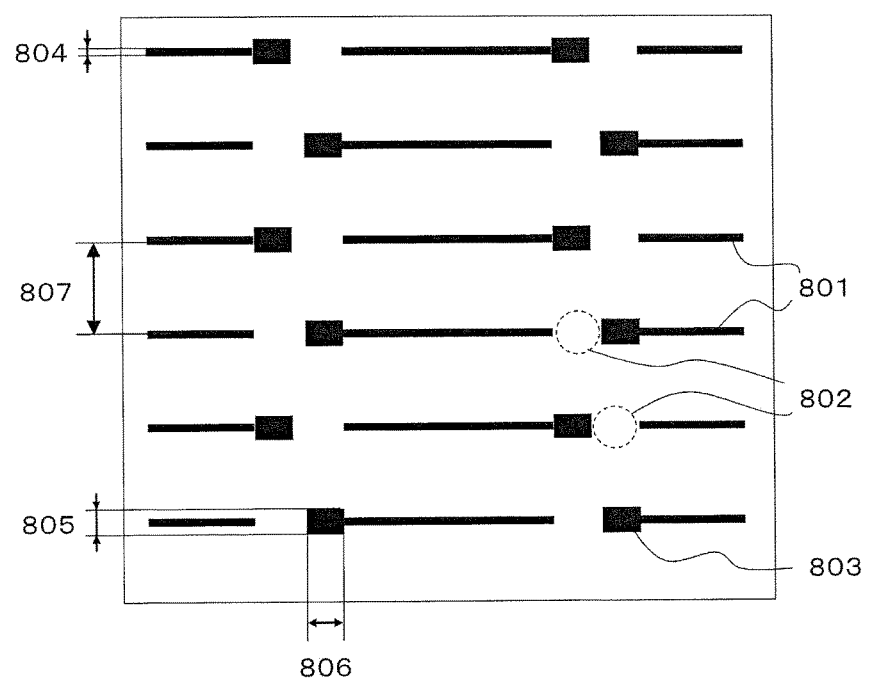
FIG. 8 is an example of a back surface electrode pattern in the back contact type solar battery cell of the present invention.

FIG. 8 shows an example of aback surface electrode pattern of a back contact type solar battery cell of the present invention. As shown in FIG. 8, in the back surface electrode pattern, a plurality of lines corresponding to fingers 801 are substantially provided in parallel. One to four finger discontinuous places 802 are present on the same line in the longitudinal direction, and small bus bars 803 are adjacent to the finger discontinuous places 802. The finger discontinuous places 802 are substantially aligned on a straight line for every line. It is preferable that the finger 801 has a line width 804 of 50 to 500 μm, and the small bus bar 803 has a line width 805 of 200 to 2000 μm and a length 806 of 200 to 5000 μm. A distance 807 between the fingers 801 is preferably 300 to 5000 μm.

The paste contains a component for increasing adhesive strength between the silicon substrate and the electrode. The component is referred to as glass frit. Since the kind and amount of the glass frit required for the p-type diffusion layer are different from those required for the n-type diffused layer, the paste may be independently printed on a p-type electrode and an n-type electrode. In this case, for example, it is necessary to independently prepare a pattern when the p-type electrode is printed during first printing and a pattern when the n-type electrode is printed during second printing. Since the small bus bar portion nearly unrequires a glass frit component, the paste may be independently printed on the small bus bar portion and a finger portion.

After these printings, in a firing furnace, firing is performed at 500 to 900° C. for 1 to 30 minutes, and silver powder is passed through the silicon nitride film (fire through), to provide electrical connection between the electrode and silicon.

As described above, the present invention has been described using the embodiments, but the technical scope of the present invention is not limited to the range described in the embodiments. It is apparent for a person skilled in the art that various changes or improvements can be added to the embodiments. It is apparent from the description of claims that the technical scope of the present invention may include a form to which the changes or the improvements are added. For example, the p-type substrate is used in the example, but an n-type substrate may be used.

REFERENCE SIGNS LIST 101, 201, 305, 401, 501: silicon substrate
102, 202, 301, 402, 801: finger
103, 203, 302, 403: bus bar
204: tab line
205, 303: current
304: diffusion layer directly below finger
502: first conductivity type diffusion region
503: second conductivity type diffusion region
504, 607: first conductivity type collecting electrode
505, 608: second conductivity type collecting electrode
506, 606: discontinuous place of first conductivity type collecting electrode
507, 603: discontinuous place of second conductivity type collecting electrode
508, 803: small bus bar
509, 805: line width of small bus bar
510, 804: line width of finger
511, 806: length of small bus bar
512: width of first conductivity type diffusion region
513: width of second conductivity type diffusion region
514: distance between first and second conductivity type electrodes
601: first conductivity type tab line
602: first conductivity type small bus bar
604: second conductivity type tab line
605: second conductivity type small bus bar
701: p-type silicon substrate
702: n-type diffusion region
703: p-type diffusion region 704: width of n-type diffusion region
705: width of p-type diffusion region
706: space between n-type and p-type diffusion regions
707: space between end of substrate and end of diffusion layer nearest to end of substrate
802: discontinuous place of finger
807: distance between fingers

The invention claimed is:

1. A solar battery comprising:
a semiconductor substrate;
a first conductivity type region formed on a back surface side located on the opposite side of an acceptance surface side of the semiconductor substrate;
a second conductivity type region formed on the back surface side of the semiconductor substrate;
the first and second conductivity type regions are alternately arranged in an arrangement direction, each of the first and second conductivity type regions is continuously formed substantially linearly in a longitudinal direction, wherein the longitudinal direction is perpendicular to the arrangement direction,
a first conductivity type collecting electrode substantially linearly in the longitudinal direction and formed on the first conductivity type region; and
a second conductivity type collecting electrode substantially linearly in the longitudinal direction and formed on the second conductivity type region, wherein
the first conductivity type collecting electrode is discontinuous with a first sub-electrode and a second sub-electrode, and a first gap between the first and second sub-electrode,
the second conductivity type collecting electrode is discontinuous with a third sub-electrode and a fourth sub-electrode, and a second gap between the first and second sub-electrode,
the first gap and the second gap are substantially aligned in the arrangement direction,
the first, second, third and fourth sub-electrodes each have a first side and second side opposite to the first side in the longitudinal direction,
each of the first sides of the first and second sub-electrodes are wider than the second sides of the first and second sub-electrodes,
each of the second sides of the third and fourth sub-electrodes are wider than the first sides of the third and fourth sub-electrodes.

2. The solar battery according to claim 1, wherein the first sides of the first and second sub-electrodes and the second sides of the third and fourth sub-electrodes have a width of 200 to 2000 μm, and the second sides of the first and second sub-electrodes and the first sides of the third and fourth sub-electrodes have a width of 50 to 500 μm.

3. The solar battery according to claim 1, wherein the first sides of the first and second sub-electrodes and the second sides of the third and fourth sub-electrodes are not adjacent to an end of the semiconductor substrate in the longitudinal direction.

4. The solar battery according to claim 1, wherein the first conductivity type collecting electrode further comprises 1 to 3 additional sub-electrodes, and the second conductivity type collecting electrode further comprises 1 to 3 additional sub-electrodes.

5. A solar battery comprising:
a semiconductor substrate;
a first conductivity type region formed on a back surface side located on the opposite side of an acceptance surface side of the semiconductor substrate;
a second conductivity type region formed on the back surface side of the semiconductor substrate;
the first and second conductivity type regions are alternately arranged in an arrangement direction, each of the first and second conductivity type regions is continuously formed substantially linearly in a longitudinal direction, wherein the longitudinal direction is perpendicular to the arrangement direction,
a first conductivity type collecting electrode substantially linearly in the longitudinal direction and formed on the first conductivity type region; and
a second conductivity type collecting electrode substantially linearly in the longitudinal direction and formed on the second conductivity type region, wherein
the first conductivity type collecting electrode is discontinuous with a first sub-electrode and a second sub-electrode, and a first gap between the first and second sub-electrode,
the second conductivity type collecting electrode is discontinuous with a third sub-electrode and a fourth sub-electrode, and a second gap between the first and second sub-electrode,
the first, second, third and fourth sub-electrodes each have a first side and second side opposite to the first side in the longitudinal direction,
at least one of the first sides of the first and second sub-electrodes are wider than the second sides of the first and second sub-electrodes,
at least one of the first and second sub-electrodes has a constant width throughout the length and is near the end of the semiconductor substrate in the longitudinal direction,
at least one of the second sides of the third and fourth sub-electrodes are wider than the first sides of the third and fourth sub-electrodes
at least one of the third and fourth sub-electrodes has a constant width throughout the length and is near the end of the semiconductor substrate in the longitudinal direction.

* * * * *